(12) United States Patent
Kokubun (10) Patent No.: US 6,849,890 B2
(45) Date of Patent: Feb. 1, 2005

(54) SEMICONDUCTOR DEVICE AND MANUFACTURING METHOD THEREOF

(75) Inventor: Koichi Kokubun, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/443,782

(22) Filed: May 23, 2003

(65) Prior Publication Data

US 2004/0007729 A1 Jan. 15, 2004

(30) Foreign Application Priority Data

Jul. 15, 2002 (JP) ........................................ 2002-206174

(51) Int. Cl.$^7$ ............................................. H01L 27/108
(52) U.S. Cl. ........................ 257/296; 257/298; 257/300; 257/301; 257/302; 257/303; 257/314; 257/305; 257/311; 438/238; 438/239; 438/242; 438/243; 438/386; 438/399
(58) Field of Search ................................ 257/296, 298, 257/300–305, 311; 438/238, 239, 242, 243, 386, 399

(56) References Cited

U.S. PATENT DOCUMENTS

| | | | |
|---|---|---|---|
| 6,238,967 B1 * | 5/2001 | Shiho et al. | 438/244 |
| 6,274,441 B1 * | 8/2001 | Mandelman et al. | 438/286 |
| 6,329,235 B1 * | 12/2001 | Kuo | 438/238 |
| 6,355,954 B1 * | 3/2002 | Gall et al. | 257/297 |
| 6,444,548 B2 * | 9/2002 | Divakaruni et al. | 438/525 |

FOREIGN PATENT DOCUMENTS

| | | |
|---|---|---|
| JP | 8-17938 | 1/1996 |
| JP | 9-232444 | 9/1997 |
| JP | 10-294443 | 11/1998 |
| JP | 2000-252445 | 9/2000 |
| JP | 2000-357779 | 12/2000 |
| JP | 2002-83941 | 3/2002 |

* cited by examiner

*Primary Examiner*—Allan R. Wilson
*Assistant Examiner*—Edgardo Ortiz
(74) *Attorney, Agent, or Firm*—Oblon, Spivak, McClelland, Maier & Neustadt, P.C.

(57) ABSTRACT

A semiconductor device comprises a semiconductor substrate having first conductivity type, a trench capacitor, provided in the substrate, having a charge accumulation region, a gate electrode provided on the substrate via a gate insulating film, a gate side wall insulating film provided on a side surface of the gate electrode, drain and source regions, provided in the substrate, having a second conductivity type, an isolation insulating film provided adjacent to the trench capacitor in the substrate to cover an upper surface of the charge accumulation region, a buried strap region having the second conductivity type, the buried strap region being provided to electrically connect an upper portion of the charge accumulation region to the source region in the substrate, and a pocket implantation region having the first conductivity type, the pocket implantation region being provided below the drain and source regions and being spaced apart from the strap region.

12 Claims, 6 Drawing Sheets

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2002-206174, filed Jul. 15, 2002, the entire contents of which are incorporated herein by reference.

BACKGROUND OF THE INVENTION

1. Field of the Invention

The present invention relates to a semiconductor device and a method of manufacturing the same and, more particularly, to a memory device structure in which a trench capacitor and a MOSFET are connected via a diffusion layer and a manufacturing method thereof. The present invention will be applied to, e.g., a dynamic semiconductor memory (DRAM) and a DRAM/logic-embedded device.

2. Description of the Related Art

With recent development of information communication, the high operating speed and the high integration density of various devices have been required in the semiconductor device technical field. Under the circumstance, an SOC (System On a Chip) technique of integrating circuits having different functions into one chip is rapidly proceeding. Of such devices, a DRAM/logic-embedded device in which a DRAM and logic circuit are integrated into one chip can realize a large-capacity memory and high data transfer speed, and is growing in demand.

Figure 8:
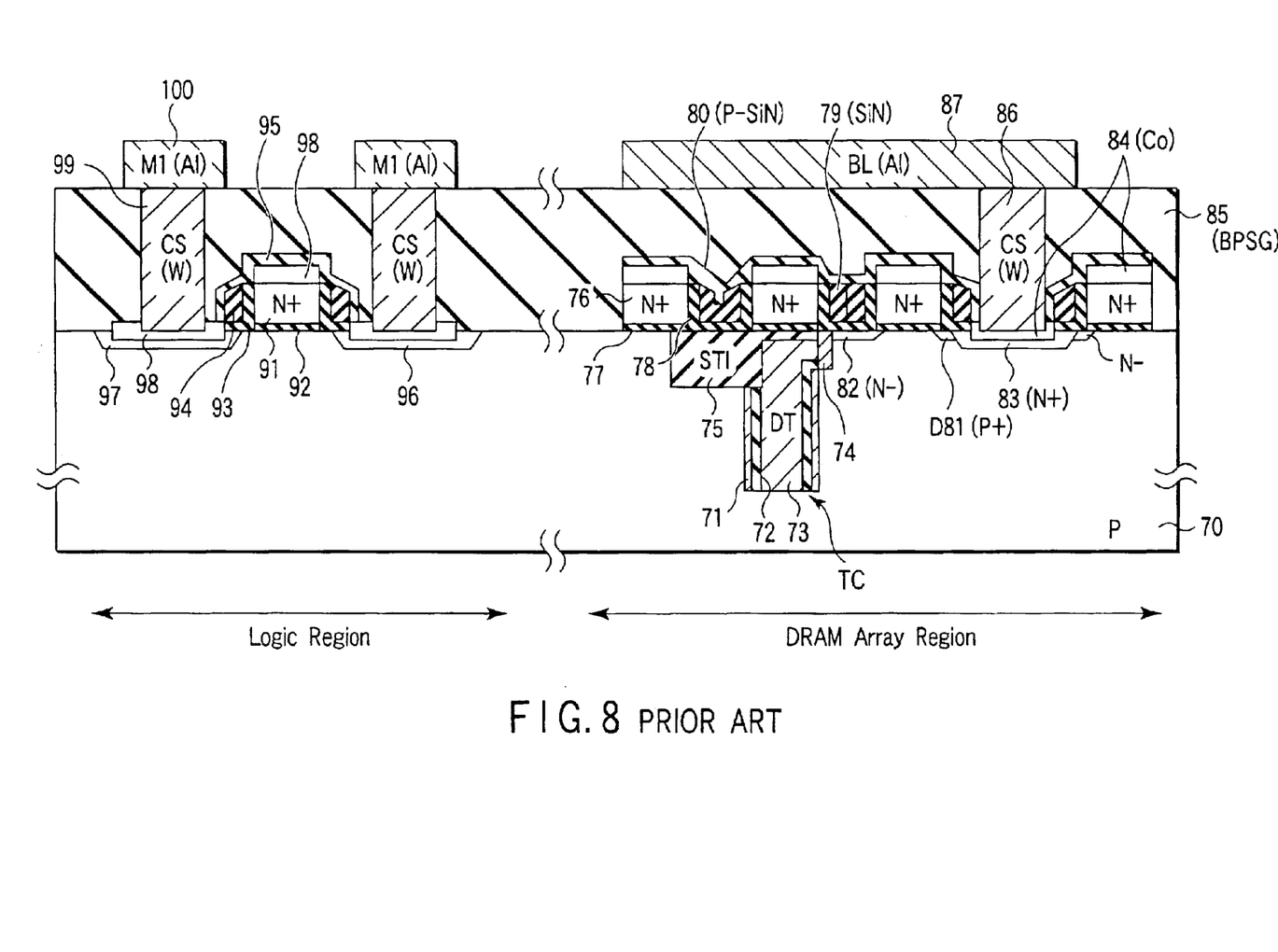
FIG. 8 is a sectional view showing a structure of a conventional DRAM/logic-embedded device.

FIG. 8 is a sectional view showing an example of a structure of a conventional DRAM/logic-embedded device.

In FIG. 8, a DRAM array region where a buried strap type trench cell is formed, and a logic region where a MOSFET having a salicide structure in a gate/source/drain is formed are formed in a semiconductor substrate 70.

A trench capacitor TC in the DRAM array region includes a deep trench (DT) selectively formed in the semiconductor substrate 70, an impurity diffusion layer 71 (corresponding to a capacitor plate) formed in the deep trench DT, and a doped polysilicon layer 73 (corresponding to a charge accumulation region) buried on the impurity diffusion layer 71 via an oxide film 72 (corresponding to a capacitor insulating film). Part of the oxide film 72 is removed such that the charge accumulation region 73 communicates with a buried strap 74 to be described later on the upper side surface of the trench.

An STI region 75 for isolation is buried in a shallow trench selectively formed adjacent to the trench capacitor TC in the semiconductor substrate 70 so as to cover the upper surface of the charge accumulation region 73 with an insulator.

Each MOSFET gate electrode 76 is formed from a doped polysilicon gate formed on the semiconductor substrate 70 via a gate insulating film 77. The gate electrodes 76 constitute word lines WL commonly connected to the MOSFET gates of cells on the same rows of a cell array.

A thin gate protection insulating film 78 is formed on the side surface of the polysilicon gate electrode 76 by oxidization after formation of the gate electrodes. A thick side wall insulating film 79 is formed from a silicon nitride (SiN) film on the gate protection insulating film 78. A contact barrier film 80 is formed from a plasma silicon nitride (P-SiN) film so as to cover the surface of the side wall insulating film 79.

A drain region 81 and source region 82 of the MOSFET are impurity diffusion regions which are selectively formed in the semiconductor substrate 70 in self-alignment with the gate electrode 76 after formation of the gate protection insulating film. The drain region 81 is shared between two adjacent MOSFETs in the cell array.

A heavily doped impurity diffusion region (contact doping region) 83 with a deep junction is formed at the center of the drain region 81 in self-alignment with the side wall insulating film 79. Metal silicide layers 84 are formed on the upper surfaces of the impurity diffusion region 83 and gate electrode 76.

The buried strap region (BEST) 74 is formed on a side of the trench capacitor TC opposite to the STI region 75 so as to connect the region 74 to the source region 82 and the upper portion of the charge accumulation region 73.

An interlayer dielectric film 85 is formed from a BPSG film so as to cover the semiconductor substrate 70. A cell contact plug (CS) 86 of, e.g., tungsten (W) is buried in a contact hole formed in the interlayer dielectric film 85 at the center of the metal silicide layer 84 in the drain region 81.

A bit line (BL) 87 is formed from a metal wiring layer containing Al as a main component on the interlayer dielectric film 85. The bit line (BL) 87 is connected to the cell contact plug 86.

In the logic region, reference numeral 91 denotes a MOSFET gate electrode; 92, a gate insulating film; 93, a thin gate protection insulating film; 94, a thick side wall insulating film formed from, e.g., a silicon nitride (SiN) film; 95, a contact barrier film formed from a plasma silicon nitride (P-SiN) film; 96 and 97, a MOSFET drain region and source region; 98, a metal silicide layer; 99, a cell contact plug formed from, e.g., tungsten (W); and 100, a metal wiring layer (M1) containing Al as a main component.

As described above, the logic region adopts a salicide structure in which a metal silicide layer is formed on the upper surface of a MOSFET gate electrode/drain region/source region. High performance is realized using a thin film for a MOSFET gate oxide film.

To realize a high integration density and high speed also in the DRAM array region, the MOS polysilicon gate of a cell must be shrunk as much as possible, downsizing the cell. Simple shrinkage degrades the cell performance due to the short channel effect.

In the conventional DRAM/logic-embedded device, when the polysilicon gate of the cell is simply shrunk to realize a high integration degree and high speed in the DRAM array region, the cell performance degrades owing to the short channel effect.

BRIEF SUMMARY OF THE INVENTION

According to a first aspect of the present invention, a semiconductor device comprises a semiconductor substrate having first conductivity type; a trench capacitor, provided in the semiconductor substrate, having a charge accumulation region; a gate electrode provided on the semiconductor substrate via a gate insulating film; a gate side wall insulating film provided on a side surface of the gate electrode; drain and source regions, provided in the semiconductor substrate, having a second conductivity type; an isolation insulating film provided adjacent to the trench capacitor in the semiconductor substrate to cover an upper surface of the charge accumulation region; a buried strap region having the second conductivity type, the buried strap region being provided to electrically connect an upper portion of the charge accumulation region to the source region in the semiconductor substrate; and a pocket implantation region having the first conductivity type, the pocket implantation region being provided below the drain and source regions and being spaced apart from the strap region.

According to a second aspect of the present invention, a method of manufacturing a semiconductor device comprises sequentially forming a trench capacitor, an element isolation region, a buried strap region having second conductivity type, and a gate insulating film in a semiconductor substrate having first conductivity type; depositing a polysilicon film on the gate insulating film to form a plurality of polysilicon gates; forming a gate protection insulating film on each of the plurality of polysilicon gates; ion-implanting an impurity of the first conductivity type into the semiconductor substrate sequentially from at least two directions having an angle of more than 0° with respect to a direction perpendicular to the semiconductor substrate by using the plurality of polysilicon gates as a mask to provide pocket implantation regions in regions below drain and source regions of a MOSFET to be formed; forming the drain and source regions of the MOSFET; and forming a bit line to connect it to the drain region of the MOSFET.

DETAILED DESCRIPTION OF THE EMBODIMENTS

Preferred embodiments according to the present invention will be described in detail below with reference to the accompanying drawings.

<First Embodiment>

A DRAM/logic-embedded device according to the first embodiment adopts a pocket implantation technique generally known in the logic device field. This technique is applied to a MOSFET of a trench cell in a DRAM array region having a buried strap type trench cell structure.

According to the pocket implantation technique, the short channel effect is suppressed by implanting impurity ions of the same conductivity type as that of a substrate into the drain/source region of a MOSFET, thereby providing a heavily doped pocket implantation region.

Figure 1:
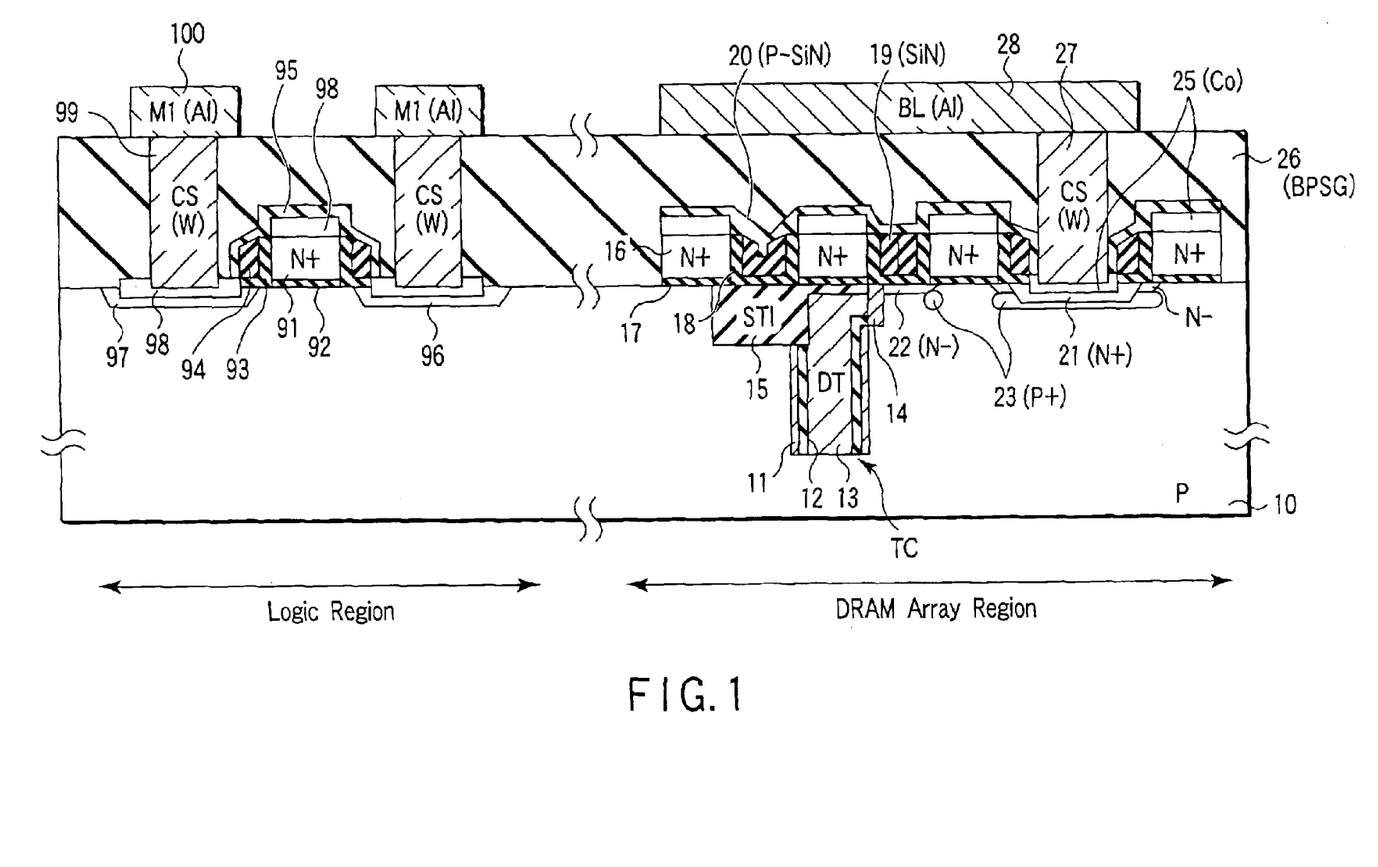
FIG. 1 is a sectional view showing a structure of a DRAM/logic-embedded device according to a first embodiment.

FIG. 1 is a sectional view schematically showing a DRAM/logic-embedded device according to the first embodiment.

Figure 2:
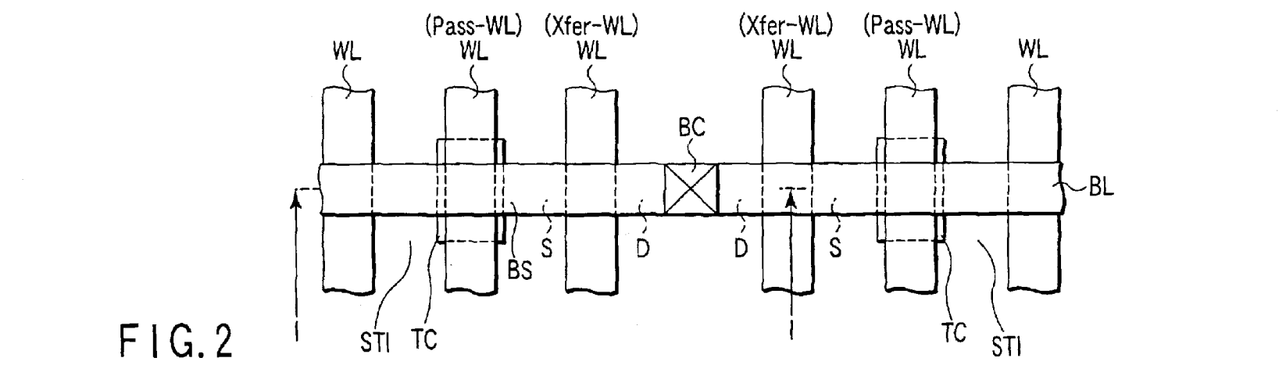
FIG. 2 is a plan view schematically showing the layout of a trench cell region, a word line WL, and a bit line BL in a DRAM array region of FIG. 1.

FIG. 2 is a plan view schematically showing the layout of the trench cell region, the word line WL, and the bit line BL in one DRAM array region of FIG. 1. A sectional structure taken along the line I—I in FIG. 2 corresponds to a DRAM array region shown in FIG. 1.

In the DRAM array region, a plurality of buried strap type trench cells each including a charge accumulation trench capacity TC, a buried strap region BS, and a transfer gate MOSFET are arranged in, e.g., a matrix of rows and columns, and they are isolated by an STI region as a unit of two trench cells adjacent to each other in the column direction.

A plurality of word lines WL which are commonly connected to the MOSFET gate electrodes of cells on the same rows of the cell array are formed. A plurality of bit lines BL which are commonly connected to MOSFET drain regions D of cells on the same columns of the cell array run perpendicularly to the word lines WL. Reference symbol S denotes a source region of the MOSFET; and BC, a bit line contact.

In the trench capacitor TC in FIG. 2, an impurity diffusion layer (capacitor plate) 11 is formed on an inner surface of a deep trench (DT) formed in a surface of a semiconductor substrate 10. A doped polysilicon charge accumulation region 13 is buried in the trench via an oxide film (capacitor insulating film) 12 on the surface of the impurity diffusion layer 11. In this case, part of the oxide film 12 is removed from the upper side surface of the trench in order to form a buried strap region (BS) 14 to be described later.

In an STI region 15 for isolation, an insulator is buried in a shallow trench selectively formed adjacent to the trench capacitor TC in the surface of the semiconductor substrate 10. The upper surface of the charge accumulation region 13 of the trench capacitor TC is covered successively to the insulator.

The buried strap region 14 is electrically connected to a MOSFET source region 22 to be described later by annealing in forming the STI region 15. The buried strap region 14 is formed by partially removing the upper portion of the oxide film 12 in the charge accumulation region 13 and diffusing an impurity into the removed portion in the semiconductor substrate 10.

Each MOSFET gate electrode (formed from doped polysilicon) 16 is formed on the surface of the semiconductor substrate 10 via a gate insulating film 17. The gate electrodes 16 are connected to the word lines WL (see FIG. 2) which are, in turn, commonly connected to the MOSFETs of cells on the same rows of the cell array.

In FIG. 2, a word line connected to the MOSFET gate electrode of the cell in FIG. 1 is called a transfer word line Xfer-WL. A word line which passes over the trench capacitor TC and is connected to the MOSFET gate electrode of a cell (not shown) is called a pass word line Pass-WL.

A thin gate protection insulating film 18 is formed on the side surface of the gate electrode 16 in FIG. 1 by oxidization (post-oxidization) after formation of the gate electrode. A thick side wall insulating film 19 is formed from, e.g., a silicon nitride (SiN) film on the protection insulating film 18. A contact barrier film 20 is formed from a plasma silicon nitride (P-SiN) film so as to cover the surface of the side wall insulating film 19.

Reference numerals 21 and 22 denote a MOSFET drain region (D) and source region (S) formed from impurity diffusion layers selectively formed in the surface of the semiconductor substrate in self-alignment with the gate electrode 16 after formation of the gate protection insulating film. In this case, the drain region 21 is shared between two adjacent MOSFETS in the cell array. The source region 22 is connected to the buried strap region 14. The drain region 21 is formed into an LDD (Lightly Doped Drain) structure. A heavily doped impurity diffusion region ($N^+$ layer) having a deep junction and a conductivity type opposite to that of the substrate is formed at the center of the surface in the drain region 21 in self-alignment with the side wall insulating film 19. A metal (e.g., Co) silicide layer 25 is formed on the upper surface of both the impurity diffusion region and the gate electrode 16.

Reference numeral 23 denotes a pocket implantation region which is formed below the MOSFET drain region 21/source region 22 of the cell and made of a high-concentration impurity (e.g., boron (B)) of the same conductivity type as that of the substrate. The pocket implantation region 23 below the source region 22 is formed in a region spaced apart from the junction between the buried strap region 14 and the source region 22.

An interlayer dielectric film 26 of a BPSG film is provided to cover the semiconductor substrate including the elements formed in the above-described way. A contact hole is formed in the interlayer dielectric film 26 at the center of the impurity diffusion layer in the drain region 21. A cell contact plug (CS) 27 of, e.g., tungsten (W) is buried in the contact hole. A bit line (BL) 28, which is composed of a metal film containing, e.g., Al as a main component, is provided on the interlayer dielectric film 26 in a direction intersecting with the word line WL so as to be connected to the cell contact plug 27.

The logic region in FIG. 1 is provided similarly to the logic region shown in FIG. 8. That is, reference numeral 91 denotes a MOSFET gate electrode; 92, a gate insulating film; 93, a thin gate protection insulating film; 94, a thick side wall insulating film formed from, e.g., a silicon nitride (SiN) film; 95, a contact barrier film formed from a plasma silicon nitride (P-SiN) film; 96 and 97, a drain region and a source region of a MOSFET; 98, a metal silicide layer; 99, a cell contact plug (CS) formed from, e.g., tungsten (W); and 100, a metal wiring layer (M1) containing Al as a main component.

FIGS. 3 to 5A schematically show sectional structures sequentially in steps of forming the DRAM array region shown in FIG. 1.

Figure 3:
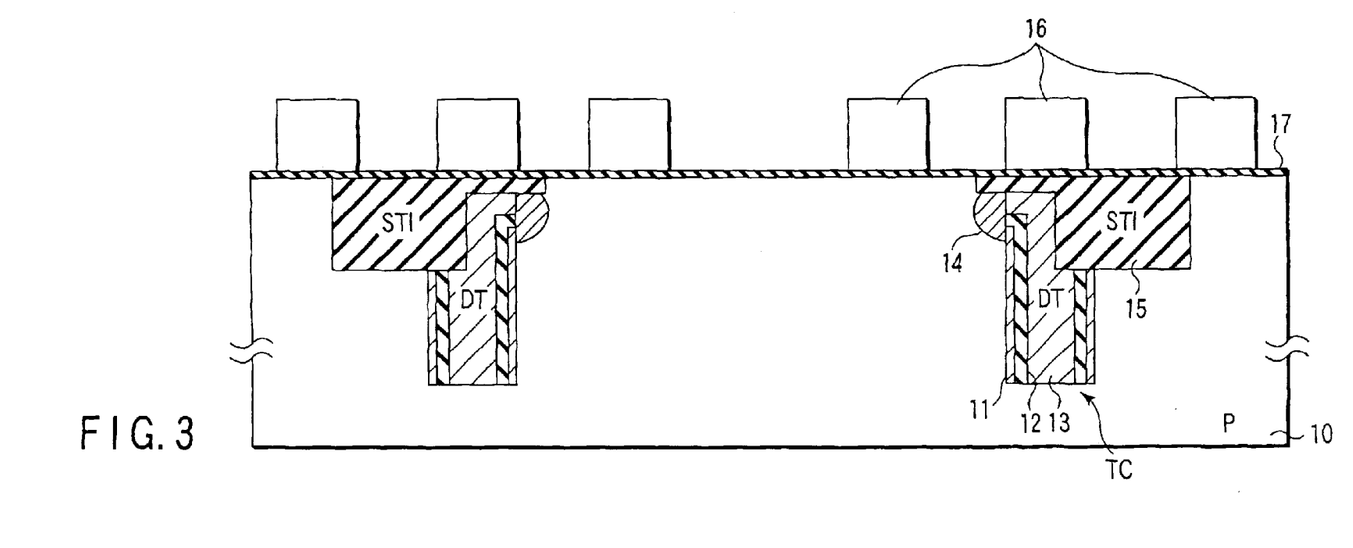
FIG. 3 is a sectional view schematically showing one of DRAM array region formation steps.

As shown in FIG. 3, the trench capacitor TC, the STI region 15, the buried strap region 14, and the gate insulating film 17 are formed on the p-type silicon substrate 10 in the same manner as the conventional one. A polysilicon gate 16 is processed to form the gate protection insulating film by post-oxidization.

Figure 4:
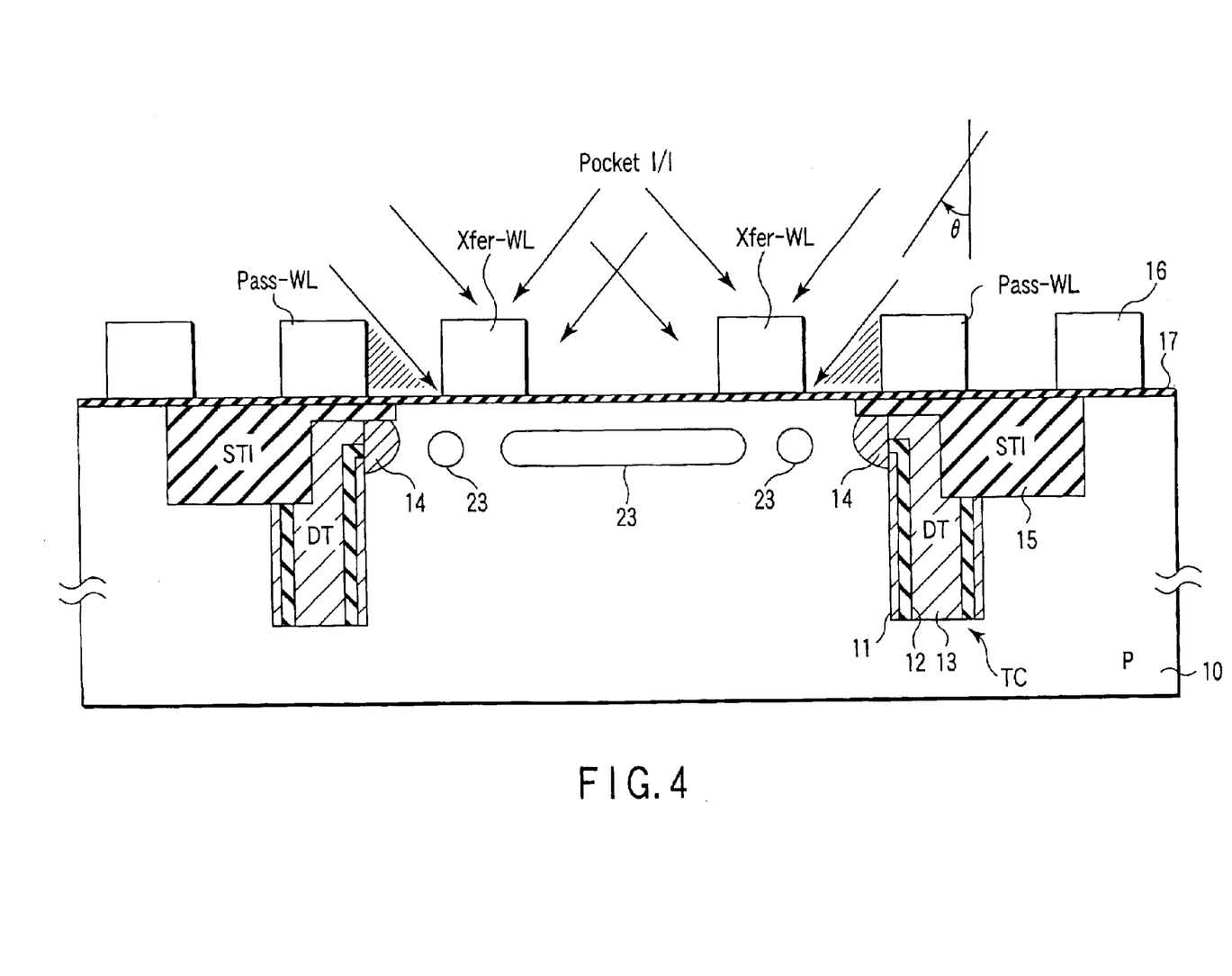
FIG. 4 is a sectional view schematically showing a step subsequent to FIG. 3.

As shown in FIG. 4, a p-type impurity of the same conductivity type as that of the substrate 10, e.g., $BF_2$ ions is sequentially implanted from at least two directions on the two sides of the word line WL at an angle θ of 0° or more with respect to a direction perpendicular to the substrate 10 (oblique ion implantation is performed). At this time, the dose, acceleration energy, and implantation angle are properly set, and pocket implantation regions 23 are formed in regions below the MOSFET drain region 21 and source region 22.

Oblique ion implantation (pocket I/I) of forming the pocket implantation regions 23 is executed. At this time, ions are implanted parallel to a direction extending from the upper edge of one side surface of the pass word line Pass-WL which passes over the trench region to the lower edge of one side surface of the transfer word line Xfer-WL. By the shadowing effect using the pass word line Pass-WL, the pocket implantation regions 23 are formed in self-alignment below the source region 22 as far as possible from the junction between the buried strap region 14 and the source region 22. The shadowing effect is more effective for a smaller interval between the transfer word line Xfer-WL and the pass word line Pass-WL.

At this time, ions are also implanted on a side opposite to the pocket implantation regions 23 via the trench region. However, since the thick oxide film of the STI region 15 exists at this portion, the ion implantation will not influence the device characteristic. Since the distance between adjacent transfer word lines Xfer-WL is large, the pocket implantation regions 23 will be formed in the entire region below the drain region 21.

Figure 5A:
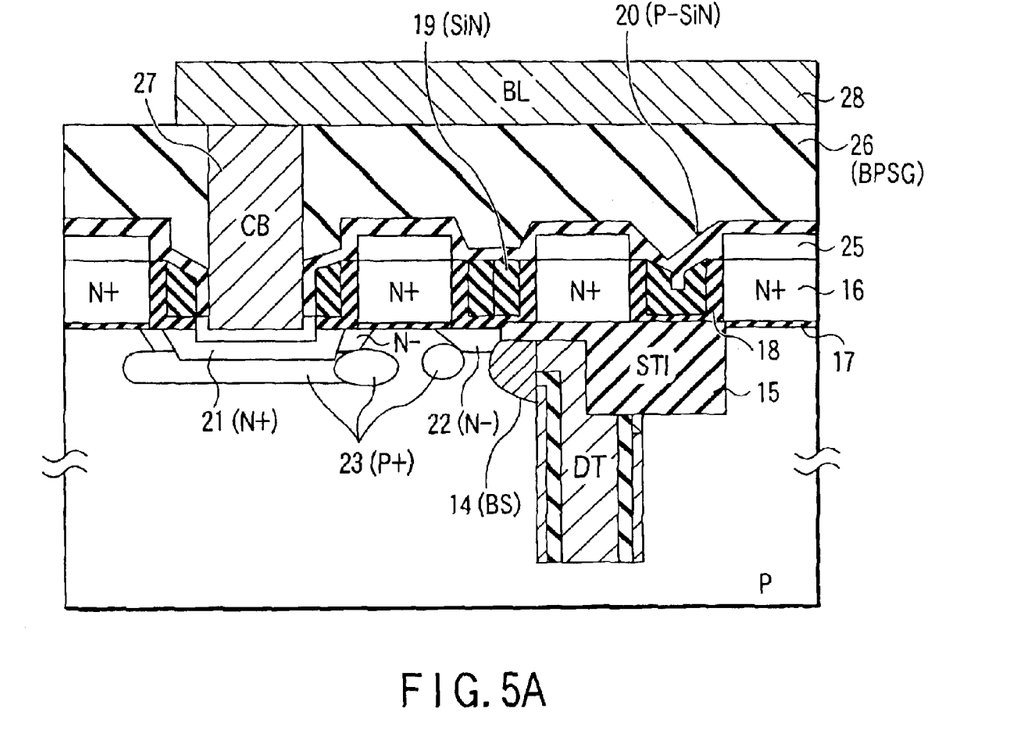
FIG. 5A is a sectional view schematically showing a step subsequent to FIG. 4.

As shown in FIG. 5A, a drain region 21 and a source region 22 of the MOSFET are formed in the same manner as the conventional one, and the source region 22 is connected to the buried strap region 14. The wiring process is carried out to connect the bit line BL to the MOSFET drain region 21.

Figure 5B:
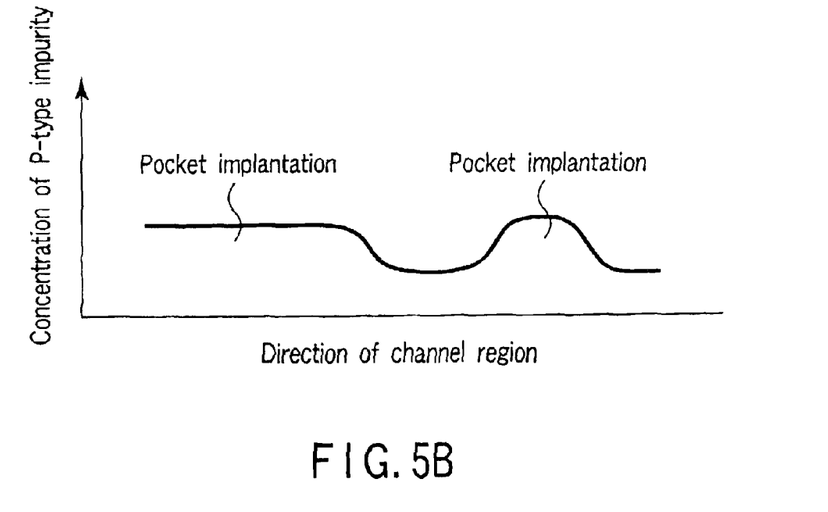
FIG. 5B is a graph showing an impurity concentration profile of a pocket implantation region in a region below a drain region from a buried strap region of a trench cell.

FIG. 5B shows the impurity concentration profile of the p-type pocket implantation region 23 in a region below the MOSFET drain region 21 from the buried strap region 14 of the trench cell shown in FIG. 5A.

In the DRAM array region according to the first embodiment, the heavily doped pocket implantation region 23 of the same conductivity type as that of the substrate 10 is formed below the MOSFET drain region 21/source region 22 having the buried strap region 14. In this case, the pocket implantation region 23 below the source region 22 is desirably formed apart from the buried strap region 14 below one channel-side end where spread of a depletion layer degrades a short channel.

Accordingly, while degradation in MOSFET junction leakage is suppressed, the short channel effect can also be suppressed to prevent degradation in cell performance. A higher concentration in the pocket implantation region 23 can further suppress the short channel effect.

As a result, the polysilicon gate width (MOSFET channel length L) can be easily reduced, realizing a small cell size.

<Second Embodiment>

Figure 6:
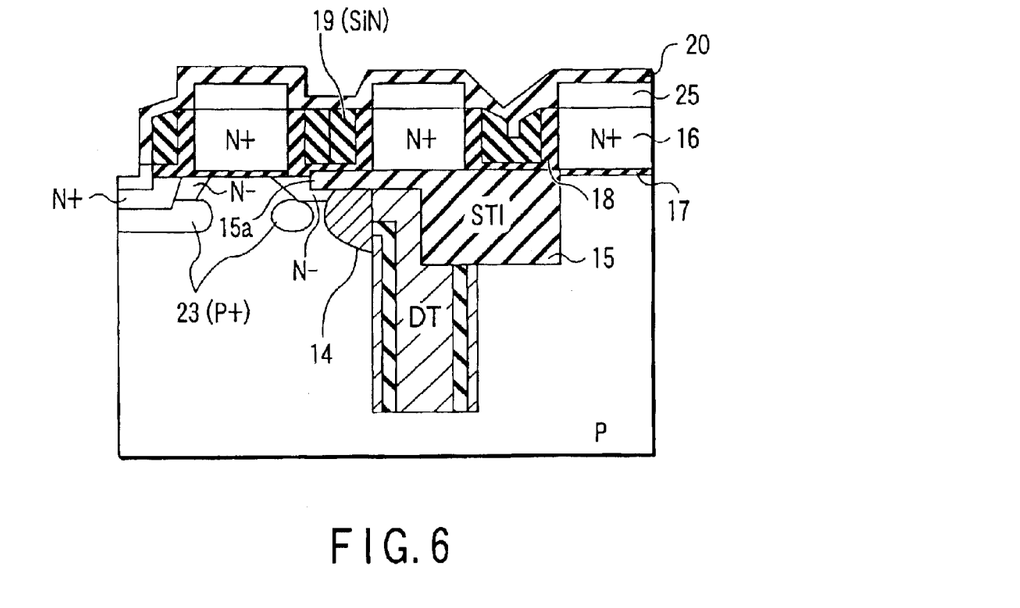
FIG. 6 is a sectional view schematically showing the trench cell structure in the DRAM array region of the DRAM/logic-embedded device according to a second embodiment.

FIG. 6 schematically shows a trench cell structure in the DRAM array region of a DRAM/logic-embedded device according to the second embodiment.

This trench cell structure is different from the trench cell structure in FIG. 5A in that an insulating film 15a in the STI region covers the upper portion of the charge accumulation region 13 and in that the length extending to the source region 22 is longer than that of the trench cell structure in FIG. 5A. The remaining structure is the same as the trench cell structure in FIG. 2. The same reference numerals as in FIG. 5A therefore denote the same parts.

According to the structure, since ions are implanted from a direction almost perpendicular to the substrate 10 in forming the pocket implantation regions 23, they can be formed at the distal end of the insulating film 15a extending toward the source region 22, i.e., in a region spaced apart from the junction between the buried strap region 14 and the semiconductor substrate 10.

In order to provide the insulating film 15a in the STI region extending toward the source region 22, doped polysilicon for the charge accumulation region 13 is buried in, e.g., the trench. In digging the upper portion, the dug region is extended toward the source region 22. Thereafter, the insulating film 15a in the STI region is buried to extend toward the source region 22.

This trench cell structure can obtain almost the same effects as those of the trench cell structure shown in FIG. 1.

<Third Embodiment>

Figure 7:
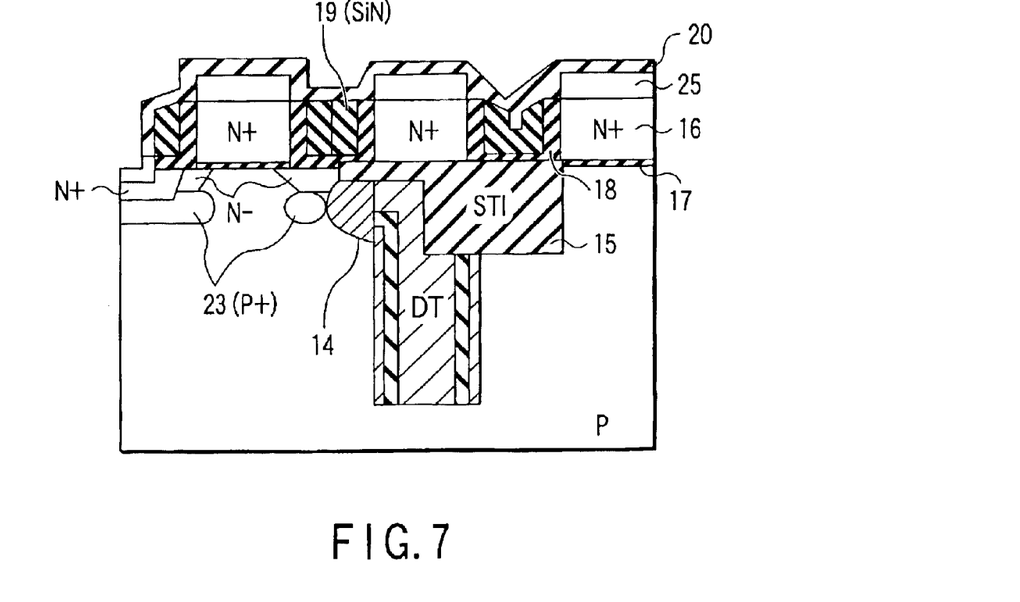
FIG. 7 is a sectional view schematically showing the trench cell structure in the DRAM array region of the DRAM/logic-embedded device according to a third embodiment.

FIG. 7 schematically shows a trench cell structure in the DRAM array region of the DRAM/logic-embedded device according to the third embodiment.

This trench cell structure is different from the trench cell structure in FIG. 1 in that pocket implantation regions 23 are formed below the drain region 21 and source region 22 of the cell by simply applying the pocket implantation technique using the gate electrodes 16 as a mask. The remaining structure is the same, and the same reference numerals as in FIG. 1 denote the same parts.

This structure can attain almost the same effects as those of the trench cell structure shown in FIG. 1. However, if one of the pocket implantation regions 23 contacts the buried strap region 14, the impurity concentration will increase at the junction, increasing the junction leakage current and degrading the charge holding characteristic of the DRAM cell. To prevent this, the pocket implantation region 23 is desirably formed as far as possible from the buried strap region 14.

In the above-described embodiments, the present invention is applied to a DRAM/logic-embedded device. The present invention can also be applied to a DRAM LSI.

Additional advantages and modifications will readily occur to those skilled in the art. Therefore, the invention in its broader aspects is not limited to the specific-details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate having a first conductivity type;
   a trench capacitor provided in the semiconductor substrate and having a charge accumulation region;
   a gate electrode provided on the semiconductor substrate via a gate insulating film;
   a gate side wall insulating film provided on a side surface of the gate electrode;
   drain and source regions provided in the semiconductor substrate and having a second conductivity type;
   an isolation insulating film provided adjacent to the trench capacitor in the semiconductor substrate to cover an upper surface of the charge accumulation region;
   a buried strap region having the second conductivity type, the buried strap region being provided to electrically connect an upper portion of the charge accumulation region to the source region in the semiconductor substrate;
   a first pocket implantation region having the first conductivity type, the first pocket implantation region being provided below the source region and being spaced apart from the strap region; and
   a second pocket implantation region having the first conductivity type, the second pocket implantation region being provided below the drain region.

2. The device according to claim 1, further comprising:
   a cell array including a plurality of buried strap configuration trench cells, each formed from the trench capacitor, the buried strap region and a MOSFET.

3. The device according to claim 1, wherein the first pocket implantation region is formed in a region spaced apart from a junction between the buried strap region and the semiconductor substrate.

4. The device according to claim 3, wherein the first pocket implantation region is provided below one end of the channel side of the source region.

5. The device according to claim 1, wherein the first and second pocket implantation region is higher in impurity concentration than the semiconductor substrate.

6. The device according to claim 1, wherein a portion of the isolation insulating film covering the upper surface of the charge accumulation region further extends to the source region.

7. The device according to claim 2, wherein in the cell array,
   a plurality of trench cells are arranged in a matrix of rows and columns,
   every two trench cells adjacent to each other in a column direction are isolated by the isolation region,
   a plurality of word lines are provided so as to be commonly connected to gate electrodes of MOSFETs in cells on the same rows of the cell array, and
   a plurality of bit lines commonly connected to drain regions of the MOSFETs in the cells on the same columns of the cell array are provided to run in a direction perpendicular to the plurality of word lines.

8. The device according to claim 1, wherein the semiconductor device includes one selected from a DRAM device and a DRAM/logic-embedded device.

9. A method of manufacturing a semiconductor device, comprising:
   sequentially forming a trench capacitor, an element isolation region, a buried strap region having a second conductivity type, and a gate insulating film in a semiconductor substrate having a first conductivity type;
   depositing a conductive film on the gate insulating film to form a plurality of gates;
   ion-implanting an impurity of the first conductivity type into the semiconductor substrate sequentially from at least two directions having an angle of more than 0° with respect to a direction perpendicular to the semiconductor substrate by using the plurality of gates as a mask to provide first and second pocket implantation regions;
   forming a source region in the semiconductor substrate to be positioned on the first pocket implantation region; and
   forming a drain region in the semiconductor substrate so that the second pocket implantation region is disposed under a region corresponding to a lower portion of the drain region.

10. The method according to claim 9, wherein the first and second pocket implantation regions are formed by a shadowing effect using the plurality of gates adjacent to each other.

11. The method according to claim 9, wherein the first and second pocket implantation regions are implanted to an impurity concentration higher than that of the semiconductor substrate.

12. The method according to claim 9, wherein the first and second pocket implantation regions are provided before a side wall insulating film is formed on each of the gates through a gate protection insulating film.

* * * * *